United States Patent [19]

Hakotani et al.

[11] Patent Number: 5,370,759
[45] Date of Patent: Dec. 6, 1994

[54] METHOD FOR PRODUCING MULTILAYERED CERAMIC SUBSTRATE

[75] Inventors: Yasuhiko Hakotani, Nishinomiya; Seiichi Nakatani; Tsuneharu Katada, both of Hirakata; Satoru Yuhaku; Kazuhiro Miura, both of Osaka; Yoshifumi Nakamura, Neyagawa, all of Japan

[73] Assignee: Matsushita Electric Industrial Co., Ltd., Japan

[21] Appl. No.: 60,981

[22] Filed: May 14, 1993

[30] Foreign Application Priority Data

May 20, 1992 [JP] Japan ................... 4-127159
Jun. 4, 1992 [JP] Japan ................... 4-144635

[51] Int. Cl.$^5$ ................... B32B 31/16; B32B 18/00
[52] U.S. Cl. ................... 156/73.1; 156/89; 156/289; 419/10
[58] Field of Search ............ 156/89, 289, 344, 73.1, 156/154, 256; 419/6, 10; 264/61

[56] References Cited

U.S. PATENT DOCUMENTS

| | | | |
|---|---|---|---|
| 3,879,509 | 4/1975 | Elderbaum | 264/56 |
| 4,642,148 | 2/1987 | Kurihara et al. | 156/89 |
| 4,753,694 | 6/1988 | Herron et al. | 156/89 |
| 4,863,683 | 9/1989 | Nakatani et al. | 419/10 |
| 4,879,156 | 11/1989 | Herron et al. | 428/137 |
| 5,085,720 | 2/1992 | Mikeska et al. | 156/89 |
| 5,130,067 | 7/1992 | Flaitz et al. | 264/60 |

FOREIGN PATENT DOCUMENTS 61-16749 5/1986 Japan .
62-5848 1/1987 Japan .
62-260777 11/1987 Japan .
4-243978 9/1992 Japan .

Primary Examiner—Christopher A. Fiorilla
Attorney, Agent, or Firm—Wenderoth, Lind & Ponack

[57] ABSTRACT

A method for producing a multilayered ceramic substrate including the steps of:

forming at least two green sheets each including a low-temperature firing glass-ceramic substrate material, forming an electrode pattern and a via hole electrode on and through each green sheet with a conductor paste, laminating said green sheets to obtain a laminate, forming a pair of green sheets which include an inorganic material which is not sintered at a firing temperature of the green sheet of the low-temperature firing glass-ceramic substrate material or lower, and then forming a hole through the inorganic material green sheet, laminating the inorganic material green sheet on the outermost green sheet of the laminate to obtain a resultant laminate in which the hole is positioned over a portion of the electrode pattern of an outermost low-temperature firing glass-ceramic green sheets of the laminate, firing said resultant laminate at the firing temperature, and removing the unsintered inorganic material. The substrate does not shrink in its plane direction and surface smoothness, electrical resistance and solderability of the top layer wiring pattern are improved.

22 Claims, 3 Drawing Sheets

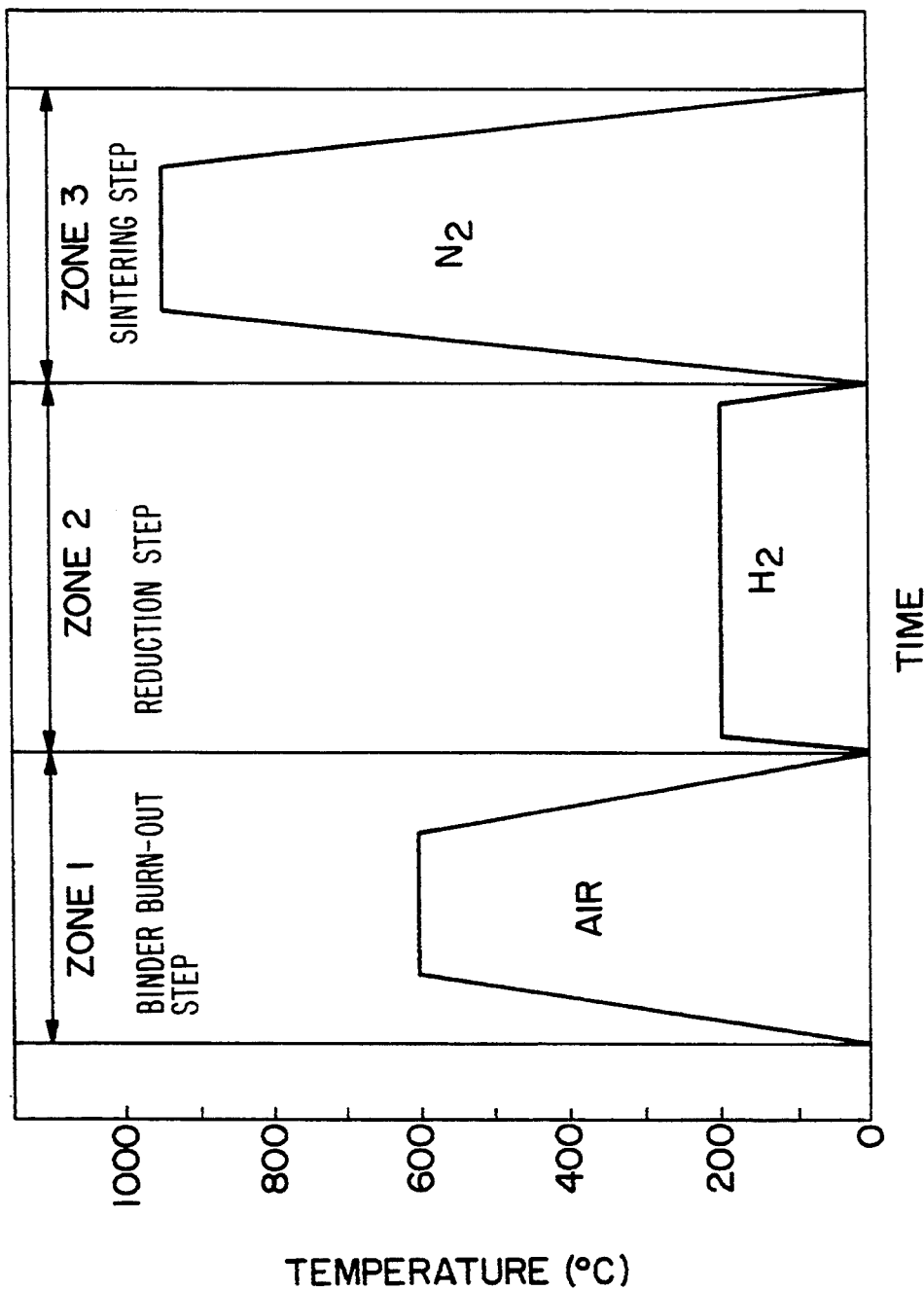

METHOD FOR PRODUCING MULTILAYERED CERAMIC SUBSTRATE

BACKGROUND OF THE INVENTION

1. Field of the Invention

The present invention relates a method for producing a multilayered ceramic substrate for mounting and interconnecting electronic components such as semiconductor LSI or chip components exterior thereof.

2. Description of the Invention

In these years, a low-temperature firing ceramic multilayered substrate has been developed wherein gold, silver, copper, palladium or their mixtures is used as a conductor material, and such a substrate has been widely used in electronics fields.

The low-temperature firing ceramic multilayered substrate is produced by steps of forming via holes through a ceramic green sheet, filling the via holes with a conductive paste, forming a desired wiring pattern on the green sheet, laminating the desired number of the green sheets to obtain a laminate and firing the laminate.

A material of the low-temperature firing substrate is fired at a temperature of about 850° to 1000 °0 C. since it should be fired at a temperature lower than a melting point of the metal material as described above. As the material of the low-temperature firing substrate, there are a glass-ceramic composite type, a crystallized glass type, a ceramic composite type, and the like. In particular, the glass-ceramic composite type comprising ceramic fillers such as alumina and crystallized glass is often used since it can provide the substrate having various combinations of properties such as a coefficient of thermal expansion, a thermal conductivity, a dielectric constant, etc. by the selection of a glass composition and a kind of the ceramic filler.

There are three kinds of electrodes used for the low-temperature firing multilayered ceramic substrate.

The first one uses a silver layer as an internal electrode of the multilayered substrate and is produce by laminating the desired number of the green sheet having the silver electrode for the low-temperature firing substrate, firing the laminated sheets in an air, printing an electrode pattern with a paste of silver-palladium on the top layer and firing it in the air. This kind of the multilayered substrate uses the silver electrode having a low impedance inside and the silver-palladium mixture which is resistant to soldering heat on the top layer.

The second one uses a silver layer as an internal electrode as in the first one and an electrode pattern of copper on the top layer of the multilayered substrate. Since the copper is used as a wiring pattern on the top layer, the electrode has lower impedance and better solderbility than those of the silver-palladium electrode as described above. However, since copper has a low eutectic point with silver, a low-temperature firing copper paste (e.g. about 600° C.) should be used. As the result, the substrate has some drawbacks such as weak adhesion strength, poor solderbility and the like (see Japanese Patent Publication No. 78798/1991).

The third one uses copper electrodes as an internal electrode and an electrode on a top layer. Though this structure is excellent in the conductor resistance, solderbility and the cost, the firing should be carried out in an inert atmosphere of, for example, nitrogen so that its production is troublesome. In general, for forming the copper electrodes, a wiring pattern should be formed by screen printing with a copper paste on the substrate, drying and firing it at a temperature lower than a melting point of copper (e.g. a firing temperature of about 850° to 950° C.) in a nitrogen atmosphere in which an oxygen partial pressure is so controlled that copper is not oxidized but organic materials in the paste are well burnt off. For the formation of a multilayered structure, a dielectric layer is printed thereon and fired under the same conditions (see Japanese Patent Kokai Publication No. 128899/1980).

However, it is very difficult to control the oxygen partial pressure at a suitable pressure in the firing step. In addition, for the formation of the multilayered structure, firing should be repeated after printing of each paste, so that a lead time becomes long and the production cost including the cost of equipments increases.

Japanese Patent Publication No. 20914/1991 discloses a method for producing a multilayered ceramic substrate using a cupric oxide (CuO) paste and consisting of a step for binder burn-out, a step for reduction and a step for firing. That is, a multilayered body is produced using cupric oxide as a raw material of a conductor, and in the step for binder burn-out, the multilayered body is heated at a temperature sufficient for pyrolysis of the organic binder under an oxygen atmosphere. In the reduction step, cupric oxide is reduced to metal copper and, in the firing step, the substrate is sintered. Thereby, a composition of the atmosphere in the firing step is easily controlled and a dense sintered material is obtained.

The multilayered ceramic substrate shrinks during the firing step. A degree of the shrinkage in accordance with the firing varies with a kind of the substrate material, a composition of the green sheet, a powder lot and the like. This will cause various problems in the production of the multilayered substrate.

Firstly, since the wiring pattern on the top layer is formed after the firing of the internal wiring pattern in the production of the multilayered ceramic substrate as described above, the internal electrode and the wiring pattern on the top layer cannot be connected due to difference in dimensions between them if the shrinkage error of the substrate material is large. As the result, in order to absorb such shrinkage error, a land having an unnecessarily large area should be formed on the top layer electrode, but such an electrode is not suitable for a circuit which requires a dense wiring pattern. Alternatively, various screens for the top wiring patterns are provided according to the specific shrinkage error of the substrate. However, the provision of a number of the screens is not economical.

If the wiring pattern of the top layer is formed at the same time as the formation of the internal electrode, no large land is necessary. However, in this simultaneous formation, the shrinkage error of the substrate still remains. Therefore, a solder paste pattern for mounting the components may not be printed on required positions due to the shrinkage error of the substrate. In addition, a position of the actually mounted component may deviate from a designed position.

Secondly, the multilayered ceramic substrate produced by laminating the green sheets has different shrinkage factors in its longitudinal and lateral directions depending on the sheeting directions of the green sheets. This is one of the problems which arise in the production of the multilayered ceramic substrate.

In order to reduce the shrinkage errors as much as possible, it is necessary to control not only the substrate material and the composition of the green sheet but also the powder lot difference and lamination conditions (e.g. pressing pressure, temperature, etc.). Still, it is said that about ±0.5% of the error of the shrinkage factor remains.

This problem is common to the firing substrate made of the ceramics or the glass-ceramics which requires the firing step. Then, if a substrate which shrinks only in a thickness direction of the substrate but does not shrink in a plane direction of the substrate could be produced, the above problems would be solved and such a substrate would be industrially attractive.

To solve the above problems, methods for producing a multilayered ceramic substrate which does not shrink in its plane direction has been disclosed.

U.S. Pat. No. 5,085,720 discloses a method for reducing X-Y shrinkage during firing of green ceramic bodies in which a release layer, which becomes porous during the firing, is placed upon the ceramic body and the assemblage is fired while maintaining pressure on the assemblage normal to the body surface.

Japanese Patent Application No. 243978/1992 also discloses a method for reducing X-Y shrinkage during firing of green ceramic bodies, which method comprises steps of providing a green ceramic body, applying to a surface of the green ceramic body a flexible release layer, firing the assemblage, cooling the fired assemblage and removing the porous layer from the surface of the sintered ceramic body. In this method, pressure is not needed during the firing.

U.S. Pat. No. 5,130,067 discloses a method for producing a multilayered ceramic substrate wherein X-Y shrinkage is controlled and X-Y distortion and Z-direction chamber are eliminated. In this method, laminating a pair of porous green sheets to green ceramic structure prevents X-Y shrinkage during firing of the ceramic structure. After the firing, unsintered porous sheets are removed.

In those methods, the green sheet comprising inorganic material which is not sintered at the firing temperature of the ceramic substrate prevents the ceramic substrate from shrinkage in its plane direction during the firing.

When the firing step is carried out after the green sheet comprising the inorganic material which is not fired at the firing temperature is laminated on either or both surfaces of the laminate, a portion of the inorganic material deposits on the electrode pattern or via electrodes formed on the surface of the glass-ceramic laminate. Such deposition of the inorganic material not only makes surface smoothness of the electrode worse and an electrical resistance of the electrode increased, but also makes solderbility of the electrode worse. Thereby, it is difficult to mount an electronic component on such an electrode. When the inorganic material deposits on only a small area of the electrode, the solderbility may be improved by the removal of the deposit with, for example, polishing. However, this causes a new problem that the number of the steps for the production of the substrate increases. In addition, it is impossible to remove the inorganic material when it is impregnated inside the electrode. When the inorganic material deposits on the via electrode, the electrical resistance of the via electrode is highly increased and electrical communication may not be achieved between the via electrode and an electrode pattern which is formed afterward on the top layer (i.e. a top layer wiring pattern) of the substrate.

SUMMARY OF THE INVENTION

One object of the present invention is to provide a multilayered glass-ceramic substrate which does not shrink in its plane direction in which a top layer wiring pattern on the substrate is fired simultaneously with the substrate and surface smoothness, electrical resistance and solderbility of the top layer wiring pattern are improved.

Another object of the present invention is to provide a multilayered ceramic substrate having via electrodes of which electrical resistance is reduced and also to provide a method producing such a substrate.

According to the present invention, there is provided a method for producing a multilayered ceramic substrate comprising steps of:

forming at least two green sheets each of which comprises a low-temperature firing glass-ceramic substrate material, an organic binder and a plasticizer, forming at least one of an electrode pattern and a via electrode on and through each of said green sheets with a conductor paste composition, laminating said green sheets to obtain a laminate to have a predetermined wiring structure of the substrate, forming at least one green sheet which comprises an inorganic material which is not sintered at a firing temperature of the green sheet of the low-temperature firing glass-ceramic substrate material or lower, and then forming at least one hole through the green sheet comprising the inorganic material so that the hole is positioned over a portion of at least one of the electrode pattern and the via electrode of one of outermost low-temperature firing glass-ceramic green sheets of the laminate when the inorganic material green sheet is to be laminated on the laminate, laminating said inorganic material green sheet having the hole on one of the outermost low-temperature firing glass-ceramic green sheets to obtain a resultant laminate comprising the inorganic material green sheet with the hole, firing said resultant laminate comprising the inorganic material green sheet with the hole at the firing temperature of the glass-ceramic material, and removing the unsintered inorganic material from the fired laminate.

In a preferred embodiment of the above method, a pair of the inorganic material green sheets each having at least one hole are formed and each of the formed inorganic material green sheets is laminated on either of the outermost green sheets of the laminate so that the laminate is sandwiched by the pair of the inorganic green sheets to obtain the resultant laminate.

Alternatively, the present method comprises a step of forming an organic resin layer which is burnt off during the firing step is formed over at least a portion of at least one of the electrode pattern and a via electrode which are formed on and through at least one of outermost low-temperature firing glass-ceramic green sheets of the laminate before a lamination step of the inorganic material green sheet having no hole on said outermost low-temperature firing glass-ceramic green sheet, in place of the formation step of the green sheet having the hole and the lamination step of the inorganic material green sheet having the hole in the above method.

It is of course possible that the organic resin layers are provided over at least a portion of at least one of the electrode pattern and the via electrode on both of the outermost low-temperature firing glass-ceramic green sheets as in the case of the above preferred embodiment.

The hole of the green sheet comprising the inorganic material and the formation of the organic resin layer both prevent direct contact of the green sheet comprising the inorganic material with a portion of the electrode pattern or the via electrode when the pair of the green sheets comprising the inorganic material are laminated on the both surfaces of the laminate of the green sheets comprising the low-temperature firing glass-ceramic substrate material.

The method of the present invention produces a multilayered glass-ceramic substrate which has an electrode pattern on a top layer having better surface smoothness, lower electrical resistance and better solderbility or a via electrode having a lower electrical resistance.

BRIEF DESCRIPTION OF THE DRAWINGS

FIG. 4 is a graph which indicates firing conditions of the methods of Examples 2 and 4.

DETAILED DESCRIPTION OF THE INVENTION

Figure 1:
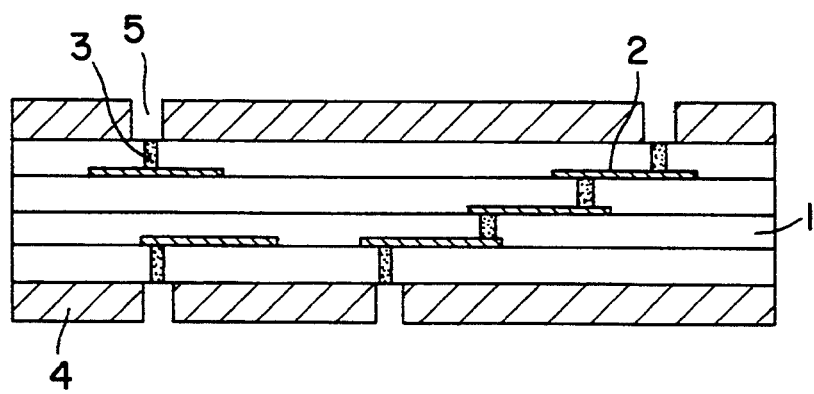
FIG. 1 schematically shows a cross sectional view of a multilayered ceramic substrate of the present invention produced in Example 1, FIG. 2 schematically shows a cross sectional view of a multilayered ceramic substrate of the present invention produced in Example 3.

In the method of the present invention, as the low-temperature firing glass-ceramic substrate material, any of a conventionally used material may be used. Preferred examples of such a material are glasses such as borosilicate glass and lead-borosilicate glass (see U.S. Pat. No. 5,004,640) and ceramics such as alumina, calcia and magnesia.

Examples of the binder are polyvinyl butyral resins, cellulose derivatives (e.g. ethyl cellulose), (meth)acrylic resins, polyvinyl alcohols and the like.

Examples of the plasticizer are phthalates, e.g. di-n-butyl phthalate, benzyl-n-butyl phthalate, dinonyl phthalate etc.), aliphatic dibasic acid esters (e.g. di(2-ethylhexyl) adipate or sebacate, etc.) and the like.

The green sheet of such a glass-ceramic substrate material is formed by a conventional method such as doctor blading, roll coating, calendaring and the like. Typical methods are disclosed in U.S. Pat. Nos. 4,301,324 and 4,234,367.

On the green sheet, the electrode patten is formed by a conventional method such as screen printing and the like. Instead of or in addition to the electrode pattern, at least one via electrode is formed through the green sheet also by a conventional method such as punching or drilling. Typical methods are disclosed in U.S. Pat. No. 4,497,677. In some case, the electrode pattern may not be provided on the green sheet or vise versa. Namely, the green sheet comprising the low-temperature firing glass-ceramic substrate may contain only the via electrode(s) or vice versa. It is important that the electrode pattern and/or the hole electrode should be supplied to each green sheet so as to provide a predetermined wiring structure of the final substrate.

The green sheets of the lower-temperature firing substrate material having the electrode pattern thereon and/or the via electrodes are laminate-stacked to obtain a laminate of the green sheets in a conventional manner.

The lamination conditions include a temperature of 50° to 150° C. and a pressure of 50 to 200 kg/cm². The laminate stacking method is disclosed in, for example, U.S. Pat. No. 4,234,367.

Specific examples of the inorganic material which is not sintered at a firing temperature of the green sheets of the low-temperature firing substrate material or lower are $Al_2O_3$, MgO, $ZrO_2$, $TiO_2$, BeO, BN and the like. The specific examples of the inorganic material are disclosed in, for example, U.S. Pat. No. 5,085,720.

The hole through the green sheet comprising the inorganic material are formed in a conventional manner. Examples of such a manner are punching and drilling, which are disclosed in U.S. Pat. No. 4,497,677.

The holes are so positioned that they are in contact with the via electrodes which are formed through the glass-ceramic green sheet when the green sheet comprising the inorganic material is laminated on the glass-ceramic green sheet. When a diameter of the hole is too small, the hole is destroyed during the lamination step. When the diameter of the hole is too large, shrinkage of the glass-ceramic green sheet is not sufficiently prevented during the firing step so that warpage and crack of the substrate are likely to occur. Thus, it is preferred that the formed hole has a diameter of about 0.1 to 5 mm. It should be noted that the hole may have any cross section, but it has preferably a circular cross section because of ease of formation.

The green sheet of the inorganic material having the hole can be laminated on either or both surfaces of the green sheet laminate of the low-temperature firing substrate material at a temperature of 50° to 150° C. under a pressure of 50 to 200 kg/cm². This step may be done in the lamination step of the low temperature firing substrate.

The organic resin layer is decomposed and/or burnt off at a temperature at which the laminate comprising the low-temperature firing glass-ceramic substrate is fired or lower. Specific examples of the organic resin are a polyvinyl butyral, an ethyl cellulose and an acrylate. The organic resin may be applied in the form of a layer and the application of the organic resin may be carried out in any conventional method such as screen printing of the resin paste. A thickness of the organic resin layer is preferably in the range of from 20 μm to 200 μm, for example about 100 μm.

The organic resin layer is formed at least on a portion where better surface smoothness and solderbility of the electrode are necessary when an electronic component is mounted on the substrate after the firing.

The laminate sandwiched by the green sheets which comprises the inorganic material is fired by first burning-out the binder and the organic resin at a temperature of 400° to 750° C. in an air for a suitable time of, for example, one hour, and then heating (firing) the laminate at a temperature of 800° to 1000° C. in the air for a suitable time of, for example, one hour using a suitable furnace such as an electric belt furnace.

In a further embodiment, the present invention may be combined with the reduction method which is disclosed in Japanese Patent Publication No. 20914/1991 which is referred to in the above. Namely, the present invention provide a method for producing the low-temperature firing multilayered glass-ceramic substrate comprising steps of:

forming at least the two green sheets each of which comprises the low-temperature firing glass-ceramic substrate material, the organic binder and the plasticizer, forming at least one of the electrode pattern and the via electrode with the conductor paste composition comprising cupric oxide as a main component on and through each of said green sheets, laminating said green sheets to obtain the laminate to have the predetermined wiring structure of the substrate, forming at least one green sheet which comprises the inorganic material which is not sintered at the firing temperature of the green sheet of the low-temperature firing glass-ceramic substrate material or lower, and then forming at least one hole through the green sheet comprising the inorganic material, laminating said inorganic material green sheet having the hole on one of outermost low-temperature firing glass-ceramic green sheets of the laminate so that the hole is positioned over a portion of at least one of the electrode pattern and the via electrode of one of the outermost low-temperature firing glass-ceramic green sheets of the laminate to have a resultant laminate, heating the resultant laminate in an oxidizing atmosphere at a temperature at which the organic binder of the laminate and an organic component of the conductor paste composition such as an organic binder and a plasticizer are decomposed and burnt off, and then the heated laminate is subject to a reduction treatment under a reducing atmosphere, firing the laminate under an inert atmosphere, and removing the unsintered inorganic material from the fired laminate.

In the above embodiment, the heating treatment which burns off the binder and the organic component is preferably carried out at a temperature in a range from 200° C. to 800° C., preferably from 400° C. to 700° C., for example 600° C. The oxidizing atmosphere includes, for example, an air and a atmosphere comprising oxygen.

The reduction treatment is carried out in a reducing atmosphere comprising hydrogen. For example, an atmosphere consisting essentially of hydrogen or a mixture of hydrogen and nitrogen may be used. The reduction step is carried out at a temperature in a range from 100° C. to 500° C., preferably from 150° C. to 350° C., for example 200° C.

The inert atmosphere during the firing may be an atmosphere consisting essentially of nitrogen, argon or a mixture thereof. The firing temperature depends on the kind of the low-temperature firing glass-ceramic substrate material, and usually in a range from 850° C. to 1000° C.

It is of course possible that the reduction method disclosed in the Japanese Patent Publication is combined with the present invention in which the organic resin layer is provided. In such an embodiment, it is preferred that the organic resin layer is decomposed and/or burnt off during the heating step.

After firing in any embodiment of the present invention, the unsintered inorganic material is removed by a conventional method such as sand blast, ultrasonic cleaning, brushing, water-jetting and the like.

DESCRIPTION OF THE PREFERRED EMBODIMENTS

The method for producing the multilayered ceramic substrate which has, on a top layer of the substrate, the electrode pattern/i.e. the top layer wiring pattern) having the better surface smoothness, the lower electrical resistance and the better solderbility or which has, through a top layer of the substrate, the via electrode having the lower electrical resistance will be explained by making reference to the accompanying drawings.

EXAMPLE 1

Figure 3:
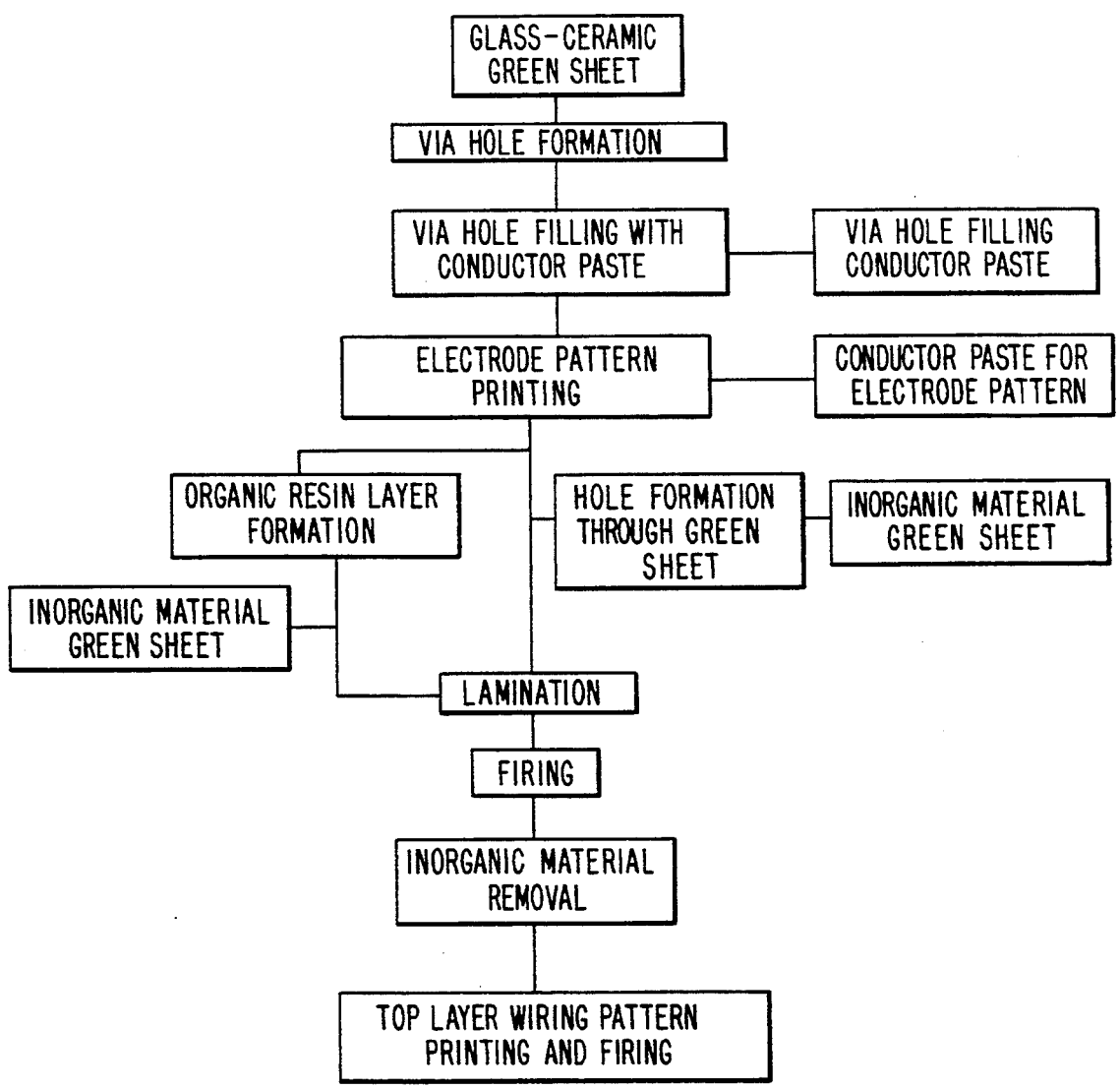
FIG. 3 is a flow chart of a method of the present invention.

One embodiment of the method for producing the multilayered ceramic substrate of the present invention will be explained according to FIG. 3 which shows a flow chart of the present method.

As a glass-ceramic substrate material, a composition of lead borosilicate glass powder and alumina powder as a ceramic material in a weight ratio of 50:50 (MLS-19 manufactured by Nippon Electric Glass Co., Ltd.) was used. This glass-ceramic powder as an inorganic component, polyvinyl butyral as an organic binder, di-n-butyl phthalate as a plasticizer and a mixed solvent of toluene and isopropanol in a weight ratio of 30:70 were mixed to prepare a slurry.

The slurry was cast on an organic film (PET) with a doctor blade to form a sheet having a thickness of about 200 $\mu$m. In this step, a process for continuously carrying out sheeting, drying, blanking and optionally via hole forming was employed. On the formed green sheet, a conductor pattern was formed and via holes were filled both with a silver paste by screen printing. The silver paste for the conductor pattern was prepared by mixing silver powder having an average particle size of 1 $\mu$m, 5% by weight of glass frits (GA-9 glass powder manufactured by Nippon Electric Glass Co., Ltd. having an average particle size of 2.5 $\mu$m) which imparts adhesion strength and a vehicle comprising ethyl cellulose as an organic binder dissolved in $\alpha$-terpineol using a roll mill to have a suitable viscosity. The silver paste for the via hole filling further contained 15% by weight of the above glass-ceramic powder.

A green sheet which is not sintered was prepared by the same method as the above formation of the glass-ceramic green sheet except that only alumina powder having an average particle size of 1.9 $\mu$m (ALM-41 manufactured by Sumitomo Chemical Co., Ltd.) was used as the inorganic component (i.e. the inorganic material of the claimed invention). This alumina green sheet of the inorganic material had a thickness of about 300 $\mu$m. The alumina green sheet was subjected to punching treatment for forming holes by using a punching machine. The holes were so positioned that they are in contact with the via hole electrodes which were formed through the glass-ceramic green sheet when the alumina green sheet was laminated on the glass-ceramic green sheet. When a diameter of the hole is too small, the hole is destroyed during the lamination step. When the diameter of the hole is too large, shrinkage of the glass-ceramic green sheet is not sufficiently prevented during the firing step so that warpage and cracking of the substrate are likely to occur. Thus, it is preferred that the formed hole has a diameter of about 0.1 to 5 mm. In this Example, each hole had a diameter of 0.5 mm.

For the production of a substrate as shown in FIG. 1, four green sheets comprising the wiring patterns and the via electrodes were stacked. On the both sides of the stacked green sheets, the alumina green sheets having the holes were stacked to obtain a composite. In such a condition, the composite was hot pressed to obtain an unfired multilayered glass-ceramic substrate having the structure of FIG. 1. Conditions of the hot pressing include a temperature of 80° C. and a pressure of 200 Kg/cm². In FIG. 1 the numerical number 1 indicates the green sheets comprising the glass-ceramic material, 2 does the internal electrodes, 3 does the via electrodes, 4 does the alumina green sheets and 5 does the holes formed through the alumina green sheet.

Then, the so pressed laminate was fired on a 96% alumina plate. The laminate was heated in an electric belt furnace under an atmosphere of the air at a temperature of 900° C. over one hour including a retention time of about 12 minutes at a temperature of 900° C.

After the firing, since there remained the unsintered alumina layers on the surfaces of the laminate, the laminate was ultrasonic-cleaned in a butyl acetate bath and the alumina layers were completely removed.

The substrate after the firing had no warpage. A shrinkage of the substrate was less than 0.1% in its plane direction. No deposition of the alumina powder was observed in the via electrodes of the top layer of the substrate. On the surface of this multilayered substrate, a top layer wiring pattern was formed with a silver-palladium paste by screen printing and firing was carried out after drying in the same manner as described above. Since the electrical resistance of the via electrodes on the top layer of the substrate is small, continuity of the top layer wiring pattern with the via electrodes was very good.

Although, in this example, $Al_2O_3$ was used as the inorganic material which is not sintered, the similar results to those of this example were obtained when BeO, MgO, $ZrO_2$, $TiO_2$ and BN were used.

EXAMPLE 2

Green sheets were produced using the same materials as in Example 1. Via holes were formed on the green sheets each having a thickness of 200 μm and then conductor pattern forming and via hole filling were carried out both with a CuO paste by screen printing. While the top layer wiring patten was formed after the firing in Example 1, a top layer wiring pattern of the substrate was also printed on the green sheet simultaneously in this example.

The CuO paste was prepared by mixing CuO powder having an average particle size of 3 μm, 3% by weight of glass frits (LS-0803 glass powder manufactured by Nippon Electric Glass Co., Ltd. having an average particle size of 2.5 μm) which imparts adhesion strength and a vehicle comprising ethyl cellulose as an organic binder dissolved in α-terpineol using the roll mill to have a suitable viscosity. The CuO paste for via hole filling further contained 15% by weight of the above glass-ceramic powder.

A green sheet which is not sintered was prepared by the same method as above except that only beryllium oxide powder having an average particle size of 1 μm (manufactured by Kanto Chemical Co., Ltd.) was used as the inorganic component. This beryllium oxide green sheet had a thickness of about 300 μm. The beryllium oxide green sheet was subjected to the punching treatment for forming holes by using the punching machine. The holes were so positioned that they are in contact with the via electrodes which were formed through the glass-ceramic green sheet when the beryllium oxide green sheet was laminated on the glass-ceramic green sheet. The punching treatment is not necessarily carried out over a whole part of the wiring pattern of the top layer, and it is sufficient that the treatment is carried out only a portion where a solder paste is printed for mounting an electronic component after firing of the substrate. In this Example, each hole had a diameter of 1.5 mm.

A predetermined number of the green sheets each comprising the wiring pattern were stacked. On the both sides of the stacked green sheets, the beryllium oxide green sheets each having the holes were stacked to obtain a composite. In such a condition, the composite was hot pressed under conditions of a temperature of 80° C. and a pressure of 200 Kg/cm² obtain an unfired substrate.

Then, the unfired substrate was fired as follows:

Firstly, the binders were removed. Since the organic binders used in the green sheet and the CuO paste were polyvinyl butyral and ethyl cellulose, they can be decomposed at a temperature of higher than 500° C. in the air. Thus, in this example, the binders were burnt off at a temperature of 600° C. Then, the laminate was reduced in an atmosphere of 100% hydrogen at a temperature of 200° C. for five hours. The Cu layer was analyzed by X-ray diffraction and the formation of 100% Cu was confirmed. Then, the laminate was fired in an electric belt furnace at a temperature of 900° C. in a pure nitrogen atmosphere.

After firing, the laminate was ultrasonic cleaned so that the unfired beryllium oxide layers on the surfaces of the laminate were removed as in Example 1. The shrinkage was estimated to be less than 0.05% and no warpage was observed. When the Cu electrode patterns on the both sides of the substrate were observed, beryllium oxide was found on a portion in which the Cu electrode was in contact with the beryllium oxide green sheet. However, a portion which was not in contact with the beryllium oxide green sheet due to the presence of the holes had no deposit of beryllium oxide but had good smoothness and solderbility of the electrode.

In this example, the top layer was wiring pattern of Cu was formed on the green sheet by screen printing with the CuO paste and co-firing. However, it is of course possible that the electrode pattern is produced by, as in Example 1, firing a substrate which comprises the beryllium oxide sheets having holes at positions corresponding to the via electrodes, removing beryllium oxide, printing the wiring pattern with the Cu paste and then firing.

Although, in this example, BeO was used as the material which is not sintered, the similar results of those example were obtained when $Al_2O_3$, MgO, $ZrO_2$, $TiO_2$ and BN were used.

EXAMPLE 3

As a glass-ceramic substrate material, a composition of lead borosilicate glass powder and alumina powder as a ceramic material in a weight ratio of 50:50 (MLS-21 manufactured by Nippon Electric Glass Co., Ltd.) was used. This glass-ceramic powder as an inorganic component, polyvinyl butyral as an organic binder, di-n-butyl phthalate as a plasticizer and a mixed solvent of toluene and isopropanol in a weight ratio of 30:70 were mixed to prepare a slurry.

The slurry was cast on an organic film (PET) with a doctor blade to form a sheet having a thickness of about 200 μm. In this step, a process for continuously carrying out sheeting, drying, blanking and optionally via hole forming was employed. On the formed green sheet, a conductor pattern was formed and via holes were filled both with a silver paste by screen printing. The silver paste for the conductor pattern was prepared by mixing silver powder having an average particle size of 1 μm, 5% by weight of glass frits (GA-9 glass powder manufactured by Nippon Electric Glass Co., Ltd. having an average particle size of 2.5 μm) which imparts adhesion strength and a vehicle comprising ethyl cellulose as an organic binder dissolved in α-terpineol using the roll mill to have a suitable viscosity. The silver paste for the via hole filling further contained 15% by weight of the above glass-ceramic powder.

In order to form an organic resin layer on the electrode pattern, an organic resin paste was prepared by dissolving polyvinyl butyral as an organic resin (S-LEC BMS manufactured by Sekisui Chemical Co., Ltd.) in a liquid mixture of toluene and isopropanol (30:70 by weight) so as to obtain a predetermined viscosity. By screen printing, the organic resin paste was printed on the via electrodes through layers which are to be a top layer and a bottom layer of the green sheets when they are laminated to have a laminate, and then the paste was dried. Each of the via electrode was covered by a printed circular layer of the organic resin paste having a diameter of about 500 μm and the organic layer had a thickness of about 100 μm after the drying.

A green sheet which is not sintered was prepared by the same method as the above formation of the glass-ceramic green sheet except that only magnesium oxide powder having an average particle size of 1 μm (manufactured by Kanto Chemical Co., Ltd., having a guaranteed reagent grade) was used as the inorganic component. This magnesium oxide green sheet had a thickness of about 400 μm.

Figure 2:
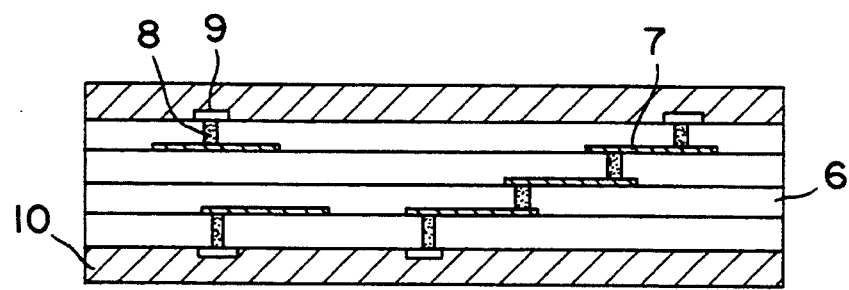

For the production of a substrate as shown in FIG. 2, two green sheets comprising the wiring patterns were stacked and the resultant stacked green sheets were sandwiched by the two green sheets further comprising the organic resin layers. On the both sides of the sandwiched green sheets, the magnesium oxide green sheets were stacked to obtain a composite as shown in FIG. 2. In such a condition, the composite was hot pressed to obtain an unfired laminate. Conditions of the hot pressing includes a temperature of 80° C. and a pressure of 200 Kg/cm$^2$. In FIG. 2, the numerical number 6 indicates the green sheets comprising the glass-ceramic material, 7 does the internal electrodes, 8 does the via hole electrodes, 9 does the organic resin layers and 10 does the green sheets comprising magnesium oxide.

Then, the so pressed laminate was fired on a 96% alumina plate. The laminate was heated in the electric belt furnace under an atmosphere of the air at a temperature of 900° C. over one hour including a retention time of about 12 minutes at a temperature of 900° C.

After the firing, since there remained unsintered magnesium oxide layers on the surface of the laminate, the laminate was ultrasonic-cleaned in a butyl acetate bath and the magnesium oxide layers were completely removed.

The substrate after the firing had no warpage. A shrinkage factor of the substrate was less than 0.04% in its plane direction. No deposit of the magnesium oxide powder was observed in the via electrodes of the top layer of the substrate. On this multilayered substrate, a top layer wiring pattern was formed with the silver-palladium paste by screen printing and then firing was carried out after drying in the same manner as described above. Since the electrical resistance of the via electrodes on the top layer of the substrate is small, continuity of the top layer wiring pattern with the via electrodes was very good.

Although, in this example, MgO was used as the material which is not sintered, the similar results to those of this example were obtained when $Al_2O_3$, BeO, $ZrO_2$, $TiO_2$ and BN were used.

EXAMPLE 4

Green sheets comprising the glass-ceramic substrate material were produced using the same materials as in Example 3. After forming via holes in the green sheets each having a thickness of about 200 μm, forming the conductor patterns and filling the via holes were carried out both with a CuO paste by screen printing. While, in Example 3, the formation of the top layer wiring pattern was carried out after the substrate firing, a top layer wiring pattern of the substrate was also formed on the green sheet simultaneously in this example.

The CuO paste was prepared by mixing CuO powder having an average particle size of 3 μm, 3% by weight of glass frits (LS-0803 glass powder manufactured by Nippon Electric Glass Co., Ltd. having an average particle size of 2.5 μm) which imparts adhesion strength and a vehicle comprising ethyl cellulose as an organic binder dissolved in α-terpineol using the roll mill to have a suitable viscosity. The CuO paste for the via hole filling further contained 15% by weight of the above glass-ceramic powder.

In order to form an organic resin layer on the electrode, an organic resin paste was prepared by dissolving ethyl cellulose as an organic resin (manufactured by Nishhin Kasei Co., Ltd.)in α-terpineol so as to obtain a predetermined viscosity. By screen printing, the organic resin paste was printed on a portion of the electrode pattern on layers which are to be a top layer and a bottom layer of the green sheets when they are laminated to have a laminate, and then the paste was dried. The organic resin layer is formed at least on a portion where better surface smoothness and solderability of the electrode are necessary when an electronic component is mounted on the substrate after the firing. The organic layer had a thickness of about 100 μm after the drying.

A green sheet which is not sintered was prepared by the same method as the above formation of the glass-ceramic green sheet except that only beryllium oxide powder having an average particle size of 1 μm (manufactured by Kanto Chemical Co., Ltd., of a guaranteed reagent grade) was used as the inorganic component. This beryllium oxide green sheet had a thickness of about 300 μm.

For the production of a substrate, a predetermined number of the green sheets comprising the wiring patterns were stacked and they were sandwiched by the two green sheets further comprising the organic resin layers. On the both of the sandwiched green sheets, the beryllium oxide green sheets were stacked to obtain a composite. In such a condition, the composition was hot pressed to obtain an unfired laminate. Conditions of the hot pressing includes a temperature of 80° C. and a pressure of 200 Kg/cm$^2$.

Then, the so pressed laminate was fired as follows:

Firstly, the binders were removed. Since the organic binders used in the green sheet and the CuO paste were polyvinyl butyral and ethyl cellulose and the organic resin layers on the electrode patterns also comprised ethyl cellulose, they can be decomposed at a temperature of higher than 500° C. in the air. Thus, in this example, the binders and the organic resin layers were burnt off at a temperature of 600° C. Then, the laminate was reduced in an atmosphere of 100% hydrogen at a temperature of 200° C. for five hours. The Cu layer was analyzed by X-ray diffraction and the formation of 100% Cu was confirmed. Then, the laminate was fired in the electric belt furnace at a temperature of 900° C. in a pure nitrogen atmosphere.

After firing, the laminate was ultrasonic cleaned so that the unfired beryllium oxide layers on the surfaces of the laminate were removed. The shrinkage was estimated to be less than 0.05% and no warpage was observed. When the Cu electrode patterns on the both sides of the substrate were observed, beryllium oxide deposited on a portion where no organic resin layer was provided. However, a portion where the organic resin layer was provided had no deposit of beryllium oxide, but had good smoothness and solderbility of the electrode.

In this example, the top layer wiring pattern of Cu was formed on the top layer of the green sheets by screen printing with the CuO paste and co-firing. However, it is of course possible that the electrode pattern is produced by, as in Example 3, forming organic resin layers on via electrode through the glass-ceramic green sheets of a laminate, sandwiching the laminate by a pair of the beryllium oxide green sheets, firing the sandwiched laminate, removing beryllium oxide, printing a top layer wiring pattern with a Cu paste composition (for example one comprising a Cu powder, a glass frit and an organic vehicle) and then firing.

Although, in this example, BeO was used as the material which is not sintered, the similar results to those of this example were obtained when $Al_2O_3$, MgO, $ZrO_2$, $TiO_2$ and BN were used.

What is claimed is:

1. A method for producing a multilayered ceramic substrate comprising the steps of:
   forming at least two green sheets each of which comprises a low-temperature firing glass-ceramic substrate material, an organic binder and a plasticizer,
   forming at least one via hole through each of said green sheets, and then filling said at least one via hole with a conductor paste composition to form at least one via electrode,
   forming at least one electrode pattern on each of said green sheets with the conductor paste composition,
   laminating said green sheets to obtain a laminate having a predetermined wiring structure and having outermost low-temperature firing glass-ceramic green sheets,
   forming at least one inorganic material green sheet which comprises an inorganic material which is not sintered at a firing temperature of the low-temperature firing glass-ceramic substrate material or lower, and then forming at least one hole through the at least one green sheet comprising the inorganic material so that the at least one hole is positioned over a portion of at least one of the at least one electrode pattern and the at least one via electrode of an outermost low-temperature firing glass-ceramic green sheet of the laminate,
   laminating said at least one inorganic material green sheet having the at least one hole on one of the outermost low-temperature firing glass-ceramic green sheets of the laminate to produce a resultant laminate wherein the at least one hole is positioned over a portion of at least one of the at least one electrode pattern and the at least one via electrode of one of an outermost low-temperature firing glass-ceramic green sheets of the laminate,
   firing the resultant laminate comprising the inorganic material green sheet with the at least one hole at the firing temperature of the low-temperature glass-ceramic substrate material, and
   removing the at least one inorganic material green sheet from the fired laminate.

2. The method according to claim 1 wherein a pair of the green sheets each comprising the inorganic material and having at least one hole are laminated on both of the outermost low-temperature firing glass-ceramic green sheets of the laminate so that the laminate is sandwiched by the pair of the green sheets comprising the inorganic material.

3. The method according to claim 1 wherein at least one hole in the green sheet comprising the inorganic material has a diameter of 0.1 to 5 mm.

4. The method according to claim 1 wherein the firing temperature is in a range of 800° to 1000° C.

5. The method according to claim 1 wherein at least one green sheet comprising the inorganic material which is not sintered at the firing temperature comprises at least one selected from the group consisting of $Al_2O_3$, MgO, $ZrO_2$, $TiO_2$, BeO and BN.

6. The method according to claim 1 wherein the conductor paste composition comprises, as a main component, one selected from the group consisting of Ag, Cu and a mixture of Ag and Pd.

7. A method for producing a low-temperature firing multilayered glass-ceramic substrate comprising the steps of:
   forming at least two green sheets each of which comprises a low-temperature firing glass-ceramic substrate material, an organic binder and a plasticizer,
   forming at least one via hole through each of said green sheets, and then filling said at least one via hole with a conductor paste composition comprising cupric oxide as a main component to form at least one via electrode,
   forming at least one electrode pattern on each of said green sheets with the conductor paste composition comprising cupric oxide as a main component,
   laminating said green sheets to obtain a laminate having a predetermined wiring structure and having outermost low-temperature firing glass-ceramic green sheets,
   forming at least one inorganic material green sheet which comprises an inorganic material which is not sintered at a firing temperature of the low-temperature firing glass-ceramic substrate material or lower, and then forming at least one hole through the at least one green sheet comprising the inorganic material so that the at least one hole is positioned over a portion of at least one of the at least one electrode pattern and the at least one via electrode of an outermost low-temperature firing glass-ceramic green sheet of the laminate,
   laminating said at least one inorganic material green sheet having the at least one hole on one of the outermost low-temperature firing glass-ceramic green sheets of the laminate to produce a resultant laminate wherein the hole is positioned over a portion of at least one of the at least one electrode pattern and the at least one via electrode of one of the outermost low-temperature firing glass-ceramic green sheets of the laminate,
   heating the resultant laminate in an oxidizing atmosphere at a temperature at which the organic binder of the green sheets and an organic component of the conductor paste composition are decomposed and burnt off, and then subjecting the heated laminate to a reduction treatment under a reducing atmosphere, firing the laminate under an inert atmosphere, and removing the at least one inorganic material green sheet from the fired laminate.

8. The method according to claim 7 wherein the hole in the green sheet comprising the inorganic material has a diameter of 0.1 to 5 mm.

9. The method according to claim 7 wherein a top layer wiring pattern is formed on the substrate with a Cu paste composition after the firing step and then the substrate is fired in an atmosphere essentially consisting of nitrogen.

10. The method according to claim 7 wherein the firing temperature is in a range of 800° to 1000° C.

11. The method according to claim 7 wherein at least one green sheet comprising the inorganic material which is not sintered at the firing temperature comprises at least one selected from the group consisting of $Al_2O_3$, MgO, $ZrO_2$, $TiO_2$, BeO and BN.

12. A method for producing a multilayered ceramic substrate comprising the steps of:

forming at least two green sheets each of which comprises a low-temperature firing glass-ceramic substrate material, an organic binder and a plasticizer, forming at least one via hole through each of said green sheets, and then filling said at least one via hole with a conductor paste composition to form at least one via electrode, forming at least one electrode pattern on each of said green sheets with the conductor paste composition, laminating said green sheets to obtain a laminate having a predetermined wiring structure and having outermost low-temperature firing glass-ceramic green sheets, forming at least one organic resin layer over at least a portion of at least one of the at least one electrode pattern and the at least one via electrode of one of the outermost low-temperature firing glass-ceramic green sheets of the substrate which layer is decomposed and burnt off during a subsequent firing step of the laminate, forming at least one green sheet which comprises an inorganic material which is not sintered at a firing temperature of the low-temperature firing glass-ceramic substrate material or lower, laminating the at least one green sheet comprising the inorganic material on the laminate having the at least one organic resin layer to obtain a resultant laminate, firing the said resultant laminate having the at least one green sheet comprising the inorganic material, and removing the at least one inorganic material green sheet from the fired laminate.

13. The method according to claim 12 wherein a pair of the green sheets each comprising the inorganic material are laminated on both of the outermost low-temperature firing glass-ceramic green sheets each of which has an organic resin layer formed thereon so that the laminate is sandwiched by the pair of the green sheets comprising the inorganic material.

14. The method according to claim 12 wherein the firing temperature is in a range of 800° to 1000° C.

15. The method according to claim 12 wherein at least one green sheet comprising the inorganic material which is not sintered at the firing temperature comprises at least one selected from the group consisting of $Al_2O_3$, MgO, $ZrO_2$, $TiO_2$, BeO and BN.

16. The method according to claim 12 wherein the conductor paste composition comprises, as a main component, one selected from the group consisting of Ag, Cu and a mixture of Ag and Pd.

17. A method for producing a multilayered ceramic substrate comprising the steps of:

forming at least two green sheets each of which comprises a low-temperature firing glass-ceramic substrate material, an organic binder and a plasticizer, forming at least one via hole through each of said green sheets, and then filling said at least one via hole with a conductor paste composition comprising cupric oxide as a main component to form at least one via electrode, forming at least one electrode pattern on each of said green sheets with the conductor paste composition comprising cupric oxide as a main component, laminating said green sheets to obtain a laminate having a predetermined wiring structure and having outermost low-temperature firing glass-ceramic green sheets, forming at least one organic resin layer over at least a portion of at least one of the at least one electrode pattern and the at least one via electrode of one of the outermost green sheets comprising the glass-ceramic substrate material which layer is decomposed and burnt off during a subsequent heating step of the laminate, forming at least one green sheet which comprises an inorganic material which is not sintered at a firing temperature of the low-temperature firing glass-ceramic substrate material or lower, laminating the at least one green sheet comprising the inorganic material on the laminate having the at least one organic resin layer to obtain a resultant laminate, heating the resultant laminate in an oxidizing atmosphere at a temperature at which the organic binder of the green sheets is decomposed and burnt off, and then the heated laminate is subject to reduction treatment under a reducing atmosphere, firing the laminate under an inert atmosphere, and removing the at least one inorganic material green sheet from the fired laminate.

18. The method according to claim 17 wherein a top layer wiring pattern is formed on the substrate with a Cu paste composition after the firing step and then the substrate is fired in an atmosphere essentially consisting of nitrogen.

19. The method according to claim 17 wherein the firing temperature is in a range of 800° to 1000° C.

20. The method according to claim 17 wherein at least one green sheet comprising the inorganic material which is not sintered at the firing temperature comprises at least one selected from the group consisting of $Al_2O_3$, MgO, $ZrO_2$, $TiO_2$, BeO and BN.

21. The method according to claim 17 wherein the removal of the inorganic material is carried out using a ultrasonic cleaning method.

22. The method according to claim 17 wherein the substrate is fired while it is pressed.

* * * * *